US006774531B1

(12) United States Patent
Gadeken

(10) Patent No.: US 6,774,531 B1
(45) Date of Patent: Aug. 10, 2004

(54) APPARATUS AND METHOD FOR GENERATING ELECTRICAL CURRENT FROM THE NUCLEAR DECAY PROCESS OF A RADIOACTIVE MATERIAL

(75) Inventor: Larry Gadeken, Houston, TX (US)

(73) Assignee: BetaBatt, Inc., Houston, TX (US)

( * ) Notice: Subject to any disclaimer, the term of this patent is extended or adjusted under 35 U.S.C. 154(b) by 29 days.

(21) Appl. No.: 10/356,411

(22) Filed: Jan. 31, 2003

(51) Int. Cl.[7] ........................ H01L 31/04; H01M 14/00; G21H 1/00

(52) U.S. Cl. ............................ 310/303; 310/301; 429/5

(58) Field of Search ................................ 310/301–305; 322/2 R; 136/202; 429/5

(56) References Cited

U.S. PATENT DOCUMENTS

| | | | | |
|---|---|---|---|---|
| 2,517,120 A | | 8/1950 | Linder | 310/304 |
| 2,666,814 A | * | 1/1954 | Shockley | 330/307 |
| 2,672,528 A | * | 3/1954 | Shockley | 330/250 |
| 2,745,973 A | | 5/1956 | Rappaport | 310/303 |
| 2,758,225 A | | 8/1956 | Annis et al. | 310/302 |
| 2,819,414 A | | 1/1958 | Sherwood et al. | 310/303 |
| 2,847,585 A | | 8/1958 | Christian | 310/302 |
| 2,864,012 A | | 12/1958 | Thomas et al. | 310/302 |
| 2,900,535 A | | 8/1959 | Thomas | 310/303 |
| 2,976,433 A | | 3/1961 | Rappaport et al. | 310/303 |
| 3,094,634 A | | 6/1963 | Rappaport | 310/303 |
| 3,257,570 A | | 6/1966 | Dehmelt et al. | 310/303 |
| 3,714,474 A | | 1/1973 | Hoff, Jr. | 310/303 |
| 3,934,162 A | | 1/1976 | Adler et al. | 310/305 |
| 4,024,420 A | | 5/1977 | Anthony et al. | 310/303 |
| 4,026,726 A | | 5/1977 | Carney | 310/303 |
| 5,082,505 A | | 1/1992 | Cota et al. | 136/253 |
| 5,396,141 A | * | 3/1995 | Jantz et al. | 310/303 |
| 5,529,950 A | | 6/1996 | Hoenlein et al. | 438/107 |
| 5,605,171 A | | 2/1997 | Tam | 136/253 |
| 5,606,213 A | | 2/1997 | Kherani et al. | 310/303 |
| 5,607,519 A | | 3/1997 | Krepak | 136/253 |
| 5,642,014 A | | 6/1997 | Hillenius | 310/303 |
| 5,721,462 A | | 2/1998 | Shanks | 310/303 |
| 5,859,484 A | | 1/1999 | Mannik et al. | 310/303 |
| 5,997,713 A | | 12/1999 | Beetz, Jr. et al. | 310/303 |
| 6,118,204 A | | 9/2000 | Brown | 205/124 |
| 6,204,087 B1 | | 3/2001 | Parker et al. | 438/56 |
| 6,238,812 B1 | | 5/2001 | Brown et al. | 429/5 |
| 6,479,920 B1 | | 11/2002 | Lal et al. | 310/309 |

OTHER PUBLICATIONS

Ultra–Low–Energy Electrons Can Break Up Uracil, http://www.aip.org/enews/physnews/2003/636.html, p. 1–2. Date: May 7, 2003.

Badel et al., "Formation of pn junctions in deep silicon pores for X–ray imaging detector applications," Department of Microelectronics and Information Technology, Royal Institute of Technology, Electrum 229, S–164 40 Kista, Sweden, 2003 Published by Elsevier Science B.V., p. 1–6.

Search of novel boron–rich borides, Last modified on Sep. 6, 2002, p. 1–8.

Astrova, E.V., et al., <<Deep Diffusion Doping of Macroporous Silicon,>> phys. stat. sol. (a) 182, 145 (2000).

Astrova, E.V., et al., <<Deep Diffusion Doping of Macroporous Silicon,>> Pis'ma Zh. Tekh. Fiz 25, 72–79 (Dec. 12, 1999).

* cited by examiner

*Primary Examiner*—Burton Mullins
(74) *Attorney, Agent, or Firm*—Raymond R. Ferrera; Arnold & Ferrera, LLP

(57) ABSTRACT

An apparatus and method for generating electrical power from the decay process of a radioactive material is disclosed, wherein a volume of radioactive material and a junction region are enclosed in a cell. The junction region is formed by appropriate construction of a number of p-type and n-type dopant sites. At least a portion of one of the junction regions is disposed within a porous region having an aspect ratio of greater than about 20:1, and disposed at an angle of greater than about 55° measured relative to the surface area in which it is formed. The dimensions and shapes of the macroporous regions and the improved junction region surface area available for collecting charged particles emitted during a radioactive decay series permit an improved current to be derived from the apparatus than would otherwise be expected given its external dimensions.

80 Claims, 4 Drawing Sheets

APPARATUS AND METHOD FOR GENERATING ELECTRICAL CURRENT FROM THE NUCLEAR DECAY PROCESS OF A RADIOACTIVE MATERIAL

BACKGROUND

The present invention relates generally to an apparatus for generating electrical current from the nuclear decay process of a radioactive material. In a specific, non-limiting example, the invention relates to an energy cell (e.g., a battery) for generating electrical current derived from particle emissions occurring within a confined volume of radioactive material (e.g., tritium gas).

Radioactive materials randomly emit charged particles from their atomic nuclei. Examples are alpha particles (ie., $^4$He nuclei) and beta particles (i.e., either electrons or positrons). This decay process alters the total atomic mass of the parent nucleus, and produces a daughter nucleus, having a reduced mass, that may also be unstable and continue to decay. In such a nuclear decay series, a fraction of the original material is consumed as energy, and eventually, a stable nucleus is formed as a result of successive particle emissions.

The principal use of controlled nuclear decay processes relates to generation of energy producing heat sources. Two of the best-known examples are nuclear reactors for producing electric power, and radioisotope thermal generators (RTGs) used in connection with various terrestrial and space applications.

Nuclear reactors have a heat-generating core that contains a controlled radioactive decay series. Heat generated within the core during the decay series is transferred to an associated working fluid, for example, water. The introduction of heat into the working fluid creates a vapor, which is in turn used to power turbines connected to electric generators. The resulting electricity is then wired to a distribution grid for transmission to users.

RTGs are also heat-generating devices, wherein electricity is produced by one or more thermocouples. The principle of operation of a thermocouple is the Seebeck effect, wherein an electromotive force is generated when the junctions of two dissimilar materials, typically metals, are held at different temperatures. RTGs are typically used for space applications due to their reasonably high power-to-weight ratio, few (if any) moving parts, and structural durability. RTGs also supply power in space applications where solar panels are incapable of providing sufficient electricity, for example, deep space missions beyond the orbit of Mars.

Previously, a major drawback when attempting to use energy derived from a nuclear decay series to power devices in remote locations has been an inefficiency of the energy conversion process. For example, it has proven difficult to achieve much greater than a ten percent energy conversion rate, especially when the energy is transferred via a thermodynamic cycle as described above.

As seen in prior art FIG. 1, a schematic representation of an energy generation process achieved by emission of a charged particle from the nucleus 1 of a radioactive material 2 is shown. Provided that an electric field is maintained between positive electrode 3 and negative electrode 4 by a potential difference 5, a charged decay particle creates electron/hole pairs that migrate toward naturally attractive electrodes 3 and 4. If a resistive load Ω completes the circuit such that positive charges 6 and negative charges 7 recombine, power is generated by the induced current flow.

Electrical current directly derived from a nuclear decay process is frequently referred to as an "alpha-voltaic" or "beta-voltaic" effect, depending on whether the charged particle emitted by a particular nucleus is an alpha particle or a beta particle, respectively.

A description of efforts to exploit the nuclear decay process of a radioactive material is found in *A Nuclear Microbattery for MEMS Devices*, published by James Blanchard et al. of the University of Wisconsin-Madison in August, 2001, and incorporated herein by reference. Blanchard et al. sought to develop a micro-battery suitable for powering a variety of microelectromechanical systems ("MEMS"). Advantages of using such devices to power MEMS include a remote deployment capability, high power-density as compared to other conventional micro-energy sources, and long-term structural durability.

Other references to nuclear batteries include U.S. Pat. No. 6,479,920 to Lal et al.; U.S. Pat. No. 6,118,204 to Brown; U.S. Pat. No. 5,859,484 to Mannik et al.; and U.S. Pat. No. 5,606,213 to Kherani et al., all of which are incorporated herein by reference. None of these nuclear batteries have been developed commercially for practical applications.

BRIEF SUMMARY OF THE INVENTION

An apparatus for generating electrical current from a nuclear decay process of a radioactive material is disclosed, the apparatus comprising: an enclosed volume of radioactive material; and a junction region disposed within said enclosed volume, wherein a first portion of said junction region is disposed at a declination angle of greater than about 55° relative to a second portion of said junction region. Also disclosed is an apparatus for generating electrical current from a nuclear decay process of a radioactive material, wherein the apparatus comprises: an enclosed volume of radioactive material; and a junction region, disposed within said enclosed volume, formed on one or more surfaces of a porous region having an aspect ratio of greater than about 20:1.

Also disclosed is a method for generating electrical current from a nuclear decay process of a radioactive material, the method comprising: enclosing a volume of radioactive material in a cell; and disposing a junction region within said enclosed volume, so that a first portion of said junction region is disposed at a declination angle of greater than about 55° relative to a second portion of said junction region. Also disclosed is a method for generating electrical current from a nuclear decay process of a radioactive material, wherein the method comprises: enclosing a volume of radioactive material in a bulk silicon material; forming at least one pore within the body of said bulk silicon material so that said at least one pore has an aspect ratio of greater than about 20:1, and disposing a junction region within said at least one pore.

DETAILED DESCRIPTION OF EXAMPLE EMBODIMENTS OF THE INVENTION

Figure 1:
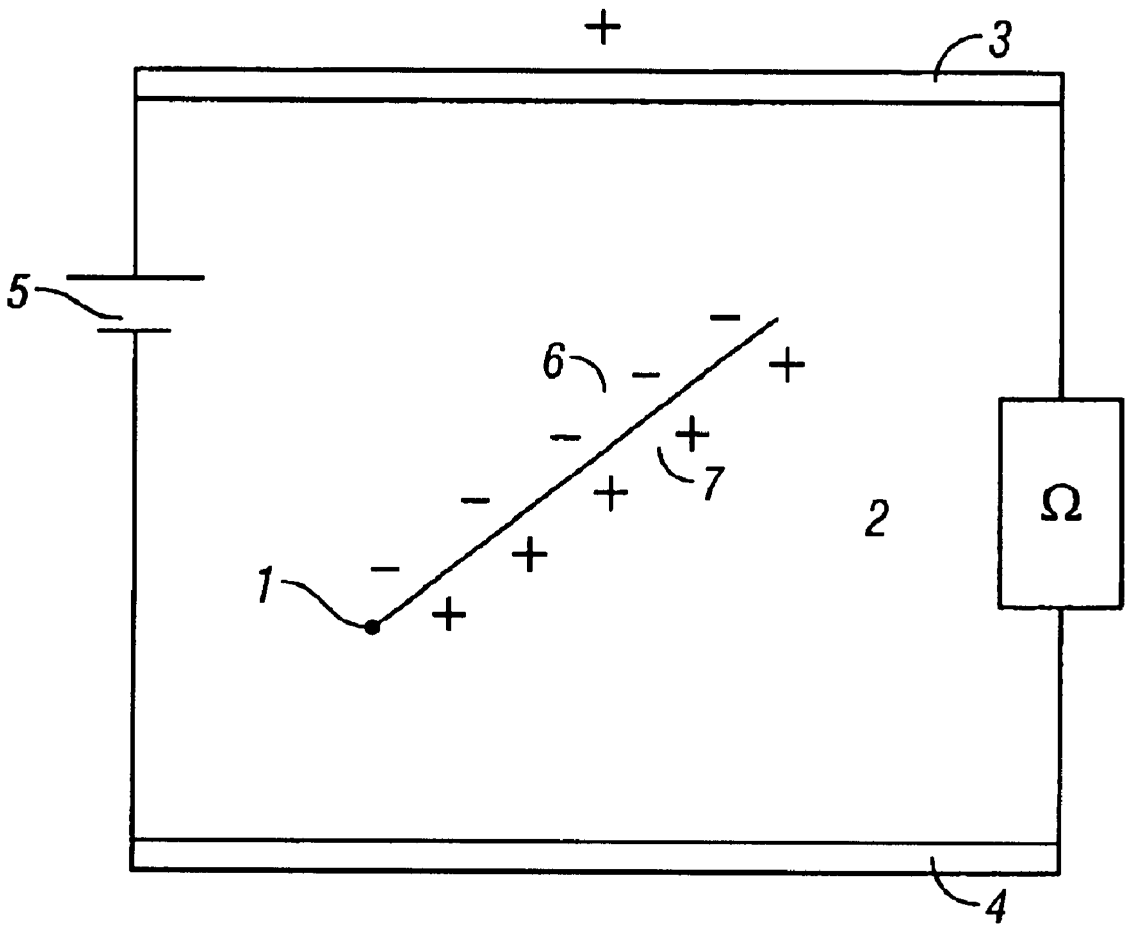
FIG. 1 (Prior Art)
FIG. 1 is a schematic representation of the electrical current generation process achieved by emission of a charged particle from a nucleus of a confined mass of radioactive material as is known in the prior art.
Figure 2A:
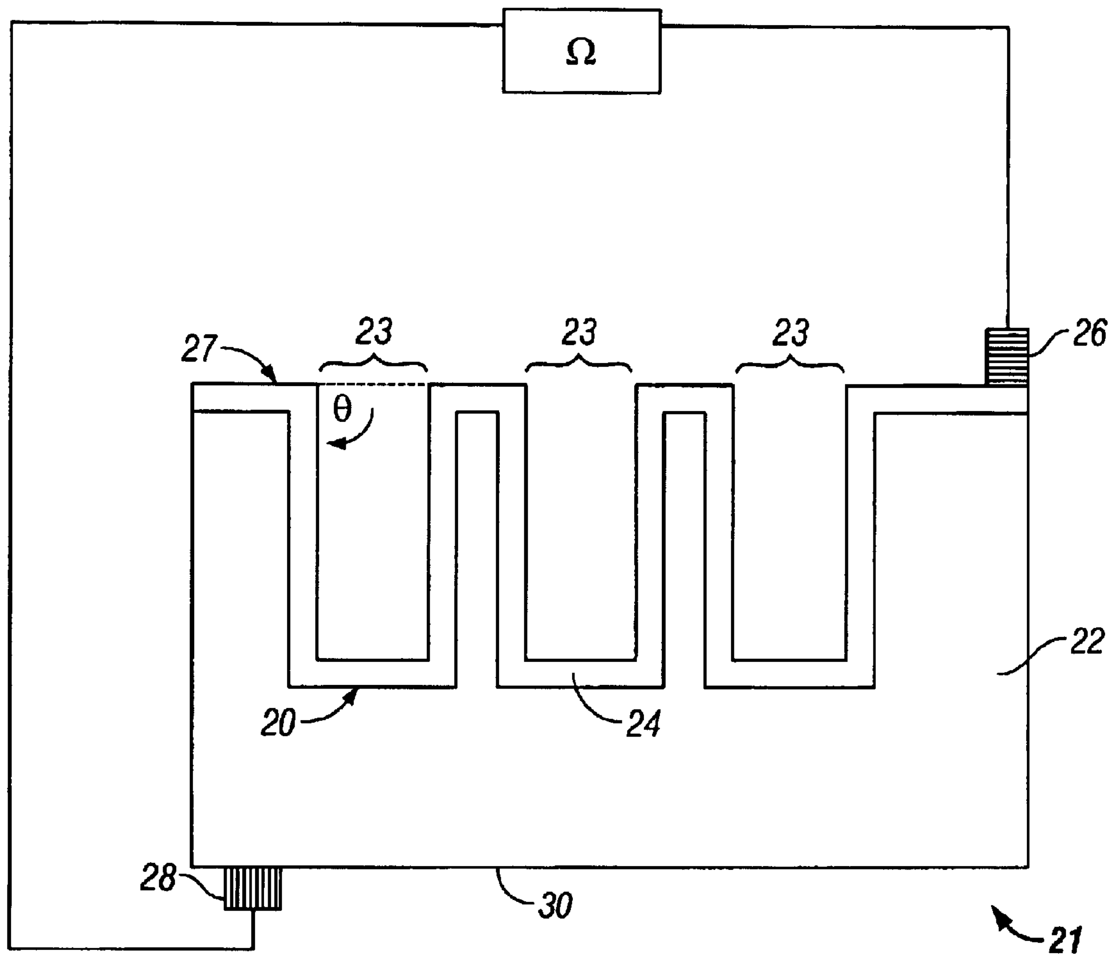
FIG. 2A is a schematic representation of an example embodiment of the present invention.

Referring now to FIG. 2A, an example embodiment is seen in which a silicon wafer 21 has been doped to provide a p-type region 22, an n-type region 24 and a junction region 20. Contact 28 connects p-type region 22 to a first side of a load Ω via a low-resistivity contact surface region 30 (e.g., a metal, for example, aluminum). A second low-resistivity contact surface region disposed between surface plane 27 and contact 26 (e.g., a metal deposit, for example, gold) permits a current transport means for charges liberated by energetic decay electron energy absorption in n-type region 24 to reach contact 26 such that n-type region 24 is in electrical communication with another side of load Ω. Tritium gas (not shown), which is disposed in deep pores 23, decays. Each decay event generates an energetic beta particle (not shown) that enters n-type region 24, where an electric field exists relative to junction region 20 and contact surface region 30 caused by the contact potential between p-type region 22 and n-type region 24. In this particular example embodiment, the emitted beta particle enters n-type region 24 and creates, via ionization, positive and negative charges within n-type region 24, so that electrons and holes separate under the influence of the electric field and migrate towards junction region 20 and contact surface region 30, thereby inducing current flow through load Ω.

The maximum travel distance of the most energetic tritium beta particle in silicon is about 4.33 $\mu$m; and, in at least one example embodiment employing a silicon wafer and tritium gas, a junction region 20 is created near a boundary of p-type region 22 and n-type region 24 at a depth just past 4.33 $\mu$m. Disposition of the junction region at a depth just greater than the maximum travel distance of the beta particle provides a nearly 100% chance that all of the charge generated when a beta particle travels through n-type region 24 will be collected, and therefore contribute to the total generated current.

The deep pores 23, in various embodiments, have a throat diameter of significantly less than the "mean free path" of the decay particle of the radioactive material disposed in the pore (in the above-described example, tritium) for the purpose of increasing the probability that a decay event will cause current to be generated. In further embodiments, the pores 23 have a length-to-diameter aspect ratio of greater than about 20:1; in a still further embodiment, the pores 23 have an aspect ratio of greater than about 30:1, again for the purpose of increasing the probability that a decay event will result in a particle entering the silicon and generating current. In still further embodiments (for example, see FIG. 2A), the walls of deep pores 23, and consequently the junction region 20 formed between p-type region 22 and n-type region 24, have a declination angle θ of greater than about 55° (measured relative to a surface plane 27 of the semiconductor surface in which they are formed). In the embodiment shown in FIG. 2A, for example, the walls of deep pores 23, and thus the associated longitudinal junction regions 20, have a declination angle θ of about 90° measured relative to the surface plane 27 of the semiconductor in which they are formed. When the radioactive material is disposed in a long, narrow volume in a semiconductor, there is a much greater probability that a beta particle produced by a decay event will enter the junction region 20 and induce a current flow. Disposing the radioactive material in a manner such that a decay particle is produced a significant fraction of a mean free path or further from the nearest energy conversion function causes a much lower current density to result from any particular volume of semiconductor 21.

It should be noted that the current of a particular device is related, at least in part, to the surface area of the junction region available to collect electrons quickly after the decay event. The greater the area of junction region 20 provided in a particular volume of radioactive material, the greater the induced current. The voltage of a particular device depends, at least in part, on the voltage of the junction region. For silicon-material junction regions, that voltage is about 0.7 volts. For other junction regions, whether derived from different semiconductor materials (e.g., germanium, gallium-arsenide, etc.) and/or other structural configurations (e.g., plated metal disposed over selected portions of a semiconductor material), the voltage is different.

Figure 2B:
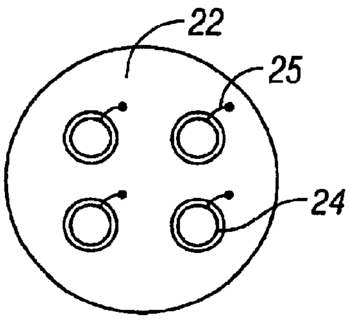
FIG. 2B is a sectional view of an example embodiment of the present invention.
Figure 2C:
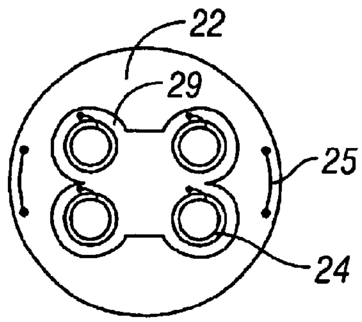
FIG. 2C is a sectional view of an example embodiment of the present invention.

Referring now to an example embodiment shown in FIG. 2B, voltage is increased by attaching multiple junction regions in series (e.g., by connecting the p-type region 22 of one junction region to the n-type region 24 of another junction region using an appropriate connector 25, for example, a metalization deposit). As seen in the example embodiment shown in FIG. 2C, total current is increased by attaching multiple junction regions in parallel (e.g., by connecting the p-type region 22 of one junction region to the p-type region 22 of another junction region using an appropriate connector 25, for example, a metalization deposit, and connecting the n-type region 24 of a first junction region to the n-type region 24 of another junction region using an appropriate connector, for example, a portion of conductive contact material 29). In this manner, according to various embodiments of the invention, distinct voltage and current characteristics are achieved for each particular application.

Figure 3:
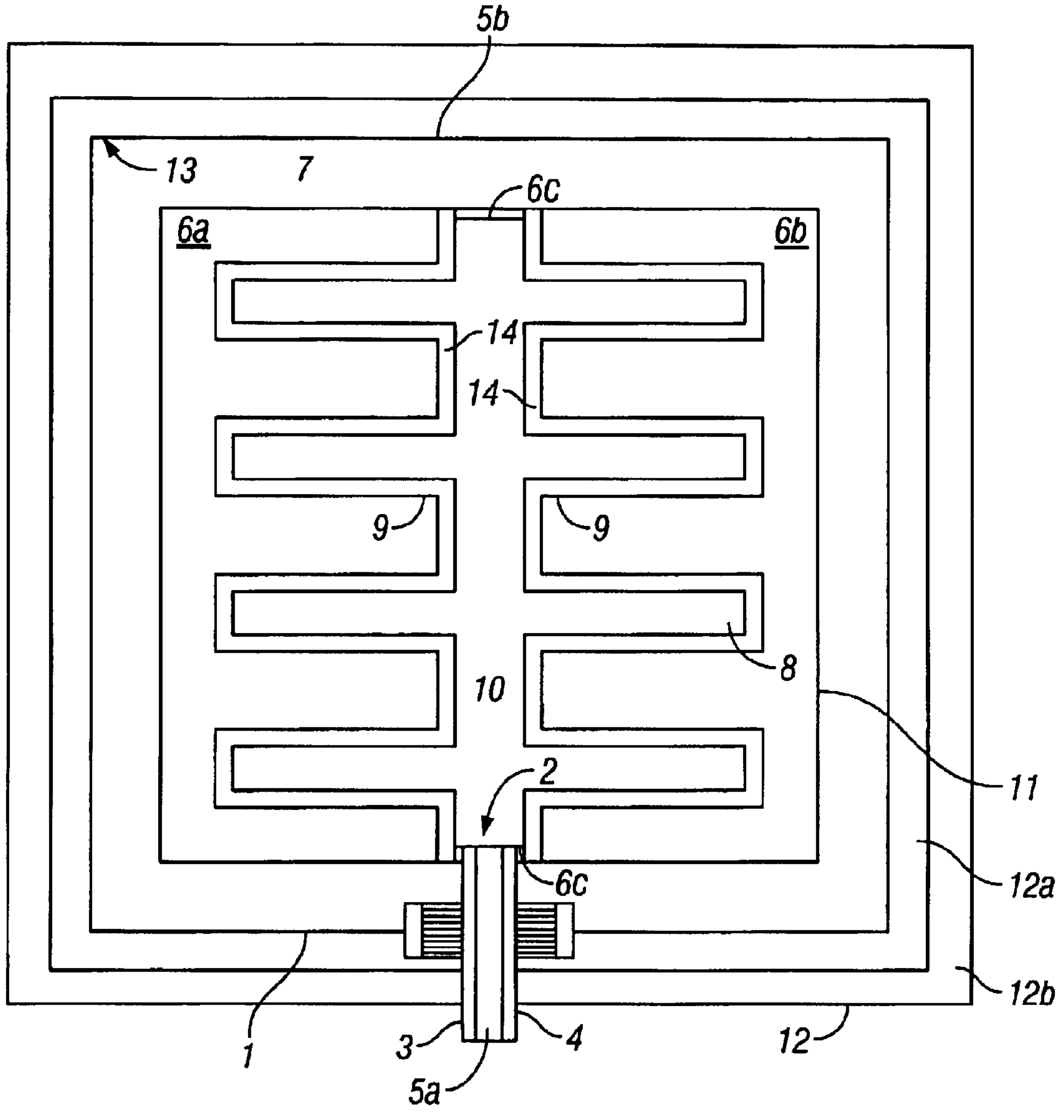
FIG. 3 is a schematic representation of an example embodiment of the present invention.

Referring now to an example embodiment shown in FIG. 3, an apparatus for generating electrical current from the decay process of a radioactive material is shown, wherein the apparatus comprises: a metal housing 1 (e.g., a metal canister); an insulated feed-through 2 (which in some embodiments has an evacuation port 3, a fill pipe 4 and an electrical connector 5*a*; although, in other embodiments, feed-through 2 is a single hollow member, e.g., a metal tube that is crimped after introduction of a radioactive material); an enclosed cell 11 comprising a semiconductor portion 6*a* and a semiconductor portion 6*b*, each of which are affixed to opposing sides of a thin conductive ring 6*c* (e.g., a metal, a doped semiconductor, or another appropriate conductor).

While FIG. 3 shows an embodiment of the invention having at least two semiconductor portions 6*a* and 6*b* connected by a conductive ring 6*c*, the present invention is practiced in some alternative embodiments using only a single semiconductor wafer. In still further embodiments, multiple layers of semiconductor material are used, thereby increasing the total available voltage. In still further embodiments, wafers suitable for practicing the invention are formed by plating layers of metal (e.g., platinum, silver, nickel, gold, etc.) to selected surfaces of a semiconductor.

Referring still to an example embodiment shown in FIG. 3, an electricity-generating cell 11 is disposed within housing 1 and adhered to an inner surface 13 of said housing by an adhesive 7 (for example, glue, tape, paint, etc.). In various other examples, adhesive 7 is conductive (e.g., conductive paint, deposited metal film, metal foil, etc.).

Cell 11 further comprises a plurality of etched pores or channels 8 having doped junction regions 9 formed on the inner surfaces of said pores or channels, and a volume of confined radioactive material 10 (e.g., a tritium gas) confined within the cell. In a further embodiment, radioactive material 10 comprises a non-radioactive material (e.g., nickel), which is converted into an appropriate radioactive species (for example, $^{63}Ni$), which thereafter decays when irradiated or otherwise excited by appropriate means.

In at least one embodiment, existing semiconductor fabrication methods are used to form porous silicon wafers having a plurality of etched pores or channels. See, for example, U.S. Pat. No. 6,204,087 B1 to Parker et al., U.S. Pat. No. 5,529,950 to Hoenlein et al.; and U.S. Pat. No. 5,997,713 to Beetz, Jr. et al., all of which are incorporated herein by reference. Generally, a pore or channel pattern is deposited onto the wafer. Masking is performed using, for example, photolithography and/or photo-masking techniques. Exposed portions of the wafer are etched (for example, by exposure to a chemical solution, or gas plasma discharge), which removes areas of the wafer that were not protected during the masking stage.

In at least one embodiment, inner surfaces of the etched pores are substantially curved in shape, for example, cylindrical or conic. In an alternative embodiment, however, a series of very narrow channels are etched. In a still further embodiment, the etched pores and/or channels are formed in the wafer in positions that are substantially equidistant from one another. In further examples, pores and/or channels etched into the wafer are substantially the same shape, although, in other examples, some of the pores and/or channels have differing shapes.

The electrical properties of the etched area are then altered by the addition of doping materials. In at least one embodiment, known doping methods are used to alter the electrical properties of the etched pores or channels. See, for example, *Deep Diffusion Doping of Macroporous Silicon,* published by E. V. Astrova et al. of the A. F. Ioffe Physico-Technical Institute, Russian Academy of Sciences—St. Petersburg in December 1999 and March 2000, each of which is incorporated herein by reference. In one process, the wafer is doped by applying atoms of other elements to the etched areas. In some embodiments, the added elements have at least one electron more than silicon and are called p-type (e.g., boron). In further embodiments, the added elements have at least one electron less than silicon and are called n-type (e.g., phosphorous).

An existing classification scheme divides relative silicon pore sizes in semiconductors into three basic classes, viz., nanoporous, mesoporous and macroporous. Nanoporous silicon contains pore sizes in the nanometer ($10^{-9}$-meters) range.

In one specific example embodiment of the invention, a macroporous silicon formation is used in which an individual pore throat diameter is on the order of a micron ($10^{-6}$-meters), for example, greater than about 1 $\mu$m and less than about 500 $\mu$m. In a more specific example embodiment, a pore throat having a diameter of greater than about 10 $\mu$m and less than about 100 $\mu$m is formed. In a still more specific example embodiment, a pore having a throat diameter of about 70 $\mu$m is formed.

In some examples, the pore depth extends through the entire thickness of a semiconductor wafer. In such examples, the junction regions of the pores are interconnected by a variety of means that will occur to those of skill in the art (e.g., exterior wire-bond connection, metalization deposits on the wafer, and/or conductive layers within the wafer itself).

In a further embodiment, a series of channels are formed in the wafer wherein a width of the channels is on the order of a micron. For example, in one embodiment of the invention, a channel having a throat width of greater than about 1 $\mu$m and less than about 500 $\mu$m is formed. In a more specific example embodiment, a pore throat diameter of greater than about 10 $\mu$m and less than about 100 $\mu$m is formed. In a still more specific example embodiment, a channel having a throat width of about 70 $\mu$m is formed.

According to a further example embodiment, preparation of appropriate silicon wafers 6*a* and 6*b* (see FIG. 3) is performed using known doping techniques. In one example, pore or channel array 8 is etched into the bodies of wafers 6*a* and 6*b*, and then doped to form a plurality of junction regions 9 on the inner wall surfaces of etched pores or channels 8. The porous wafers 6*a* and 6*b* are assembled into an enclosed cell 11, in one example, by adhering the two wafer portions onto opposite sides of a conductive ring 6*c*. A volume of radioactive material 10 (e.g., tritium gas) is introduced into enclosed cell 11.

In a further embodiment, the risk of a chemical reaction between oxygen and tritium is reduced by removal of oxygen from the cell prior to the insertion of tritium. In at least one example, the interior contents of the cell are evacuated through evacuation port 3, which is then sealed. A radioactive material 10 is then fed into cell 11 through a fill pipe 4; thereafter, fill pipe 4 is sealed. In further example embodiments, cell 11 is purged via evacuation port 3 using an inert gas (e.g., $N_2$ or argon) prior to introduction of radioactive material 10.

In some embodiments, enclosed cell 11 is disposed within a housing 1 that prevents radioactive emissions from escaping from the package. For example, certain embodiments of housing 1 comprise a metal, or a ceramic, or another suitable material constructed so as to provide rigorous containment.

Referring again to an example embodiment shown in FIG. 3, a metal canister 1 is pierced on one side by an insulated feed-through 2, which includes a first electrode 5*a* disposed in conductive contact with n-type material 14. Metallic outer surfaces of canister 1 serve as a second electrode 5*b* disposed in conductive communication with p-type material 6*a* and 6*b*. Connections 5*a* and 5*b* permit current generated within the cell to be transmitted to an external device (not shown) via electrode 5*a*. In a more specific embodiment, cell canister 1 is enclosed within the body of a durable outer container 12 in a manner similar to existing chemical batteries. In one example embodiment, cell canister 1 is disposed within a thermoplastic shell 12*a* such that only electrode 5*a* is exposed; thermoplastic shell 12*a* is then snugly fitted into metallic outer canister 12*b* such that only electrode 5*a* protrudes through the body of metallic outer canister 12*b* to permit electrical connection with an external device (not shown). In still further embodiments, two or more unit cells 11 are connected either in series or in parallel, again to achieve desired current and voltage characteristics, and then packaged in a single housing as described above; in still further embodiments, two or more individual unit cells 11 are packaged in individual housings, and electrically connected either in series or in parallel to obtain desired voltage and current characteristics.

As mentioned above, in at least some examples in which tritium gas 10 is deposited within the cell 11, the emitted charged particles are beta electrons. Beta electrons have a relatively low penetrating power. Accordingly, in at least one example, outer canister 1 is formed from a thin sheet of metallic foil, which prevents penetration of energetic particles emitted during the decay process. Thus, the possibility of radioactive energy escaping from the package is reduced. Moreover, tritium is a form of hydrogen, and the uptake of hydrogen gas by the human body is naturally very limited, even in lung tissue, since gaseous hydrogen cannot be directly metabolized. Therefore, fabrication precautions relate primarily to ventilation and dilution in the event of an inadvertent release of the tritium into the external environment.

In other example embodiments, other fluid or solid radioactive materials that emit alpha and/or gamma particles are deposited within the cell, for example, $^{63}$Ni or $^{241}$Am. In such embodiments, other containment materials and fabrication precautions are employed, and vary depending upon the precise characteristics of the radioactive material used in a particular application.

Figure 4:
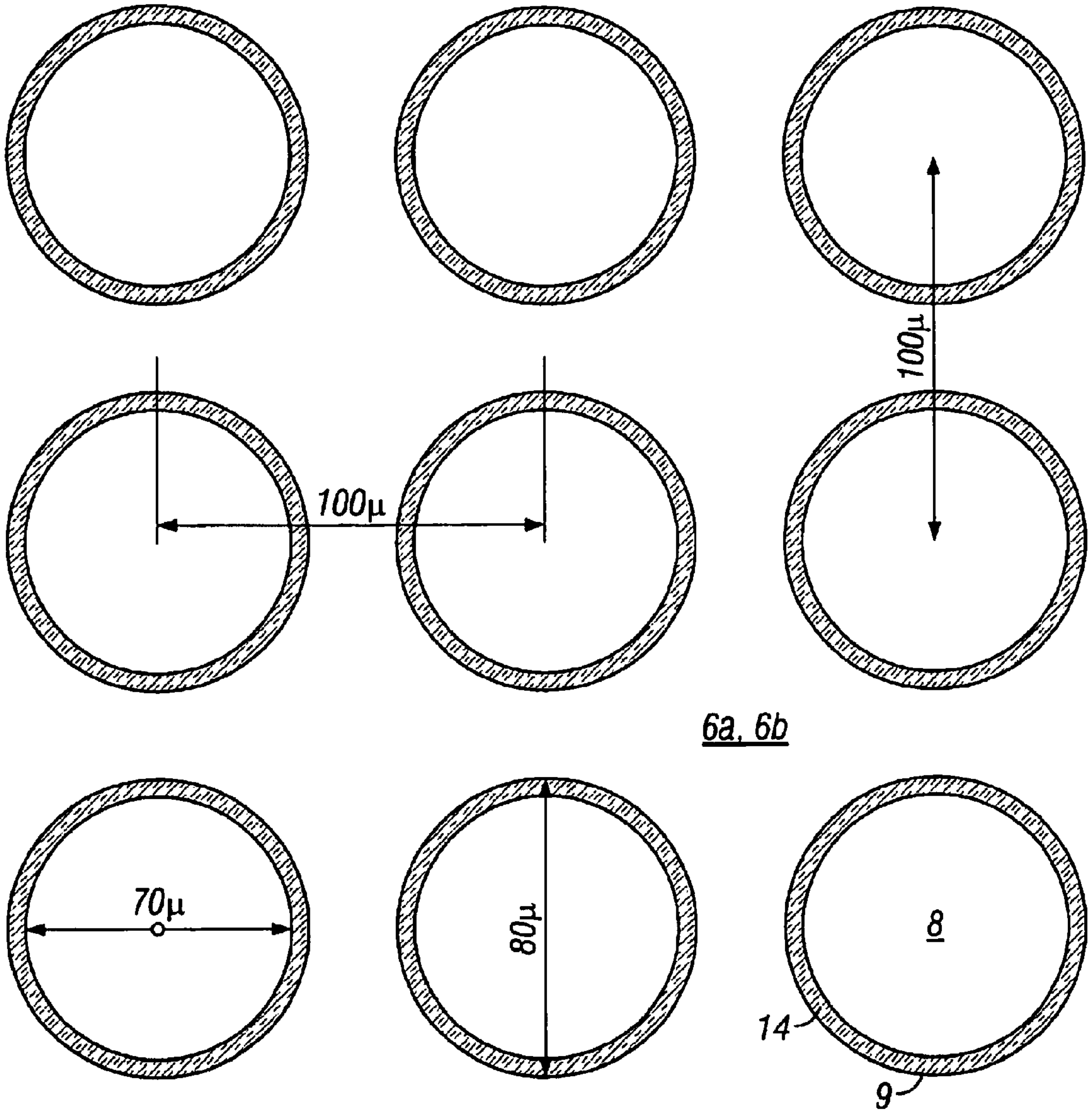
FIG. 4 is a sectional view of an example embodiment of the present invention.

Turning now to an even more specific example embodiment, FIG. 4 shows a pore array formed within a macroporous silicon cell for generating electrical current from the decay process of tritium gas is shown. As seen, a 3×3 array of circles represents a sectional view of a few cylindrical pores 8 etched into the silicon wafers 6*a* or 6*b* (as shown in FIG. 3). Cylindrical pores 8 (which, in further examples of the invention, are instead formed into multifaceted shapes, e.g., octagonal and/or hexagonal) are separated by about 100 $\mu$m in both the horizontal and vertical directions. The diameter of the pore throats is about 70 $\mu$m. The annular shading (extending to about an 80 $\mu$m diameter) indicates a junction region 9 formed by a p-n junction. Therefore, the volume fraction occupied by the pore channels in this particular example embodiment is about 0.385. Since there are approximately $8.98 \times 10^{10}$ beta decay events per second in a 1 cm$^3$ volume of tritium gas in atmospheric pressure at 20° Celsius, and it takes approximately 3.2 eV to create an electron/hole pair in silicon, a current of about $19.7 \times 10^{-6}$ amperes is generated per cubic centimeter of silicon wafer, thereby assuring a conversion efficiency of about 100%.

In still further embodiments of the invention, further radioactive materials (e.g. a liquid $^{63}$Ni solution) and/or further semiconductors (e.g., germanium, silicon-germanium composite, or gallium arsenide) and/or other materials capable of forming appropriate junction regions are employed. Other methods of forming pores and channels, and other pore and channel shapes and patterns, are used in still further example embodiments. Actual dopants of the semiconductor, and related methods of doping, also vary in other example embodiments, and are not limited to those recited above.

The foregoing is provided for illustrative purposes only, and is not intended to describe all possible aspects of the present invention. Moreover, while the invention has been shown and described in detail with respect to several exemplary embodiments, those of ordinary skill in the pertinent arts will appreciate that minor changes to the description, and various other modifications, omissions and additions may also be made without departing from either the spirit or scope thereof.

I claim:

1. An apparatus for generating electrical current from a nuclear decay process of a radioactive material, the apparatus comprising:

an enclosed volume of radioactive material; and a junction region disposed within said enclosed volume, wherein a first portion of said junction region is disposed at a declination angle of greater than about 55° relative to a second portion of said junction region.

2. The apparatus for generating electrical current from a nuclear decay process of a radioactive material of claim 1, wherein said enclosed volume of radioactive material further comprises beta particles emitted during said nuclear decay process.

3. The apparatus for generating electrical current from a nuclear decay process of a radioactive material of claim 1, wherein said enclosed volume of radioactive material further comprises alpha particles emitted during said nuclear decay process.

4. The apparatus for generating electrical current from a nuclear decay process of a radioactive material of claim 1, wherein said enclosed volume of radioactive material further comprises gamma particles emitted during said nuclear decay process.

5. The apparatus for generating electrical current from a nuclear decay process of a radioactive material of claim 1, wherein said enclosed volume of radioactive material further comprises a gaseous material.

6. The apparatus for generating electrical current from a nuclear decay process of a radioactive material of claim 5, wherein said gaseous material further comprises a tritium gas.

7. The apparatus for generating electrical current from a nuclear decay process of a radioactive material of claim 1, wherein said enclosed volume of radioactive material further comprises a liquid material.

8. The apparatus for generating electrical current from a nuclear decay process of a radioactive material of claim 7, wherein said liquid material further comprises a $^{63}$Ni solution.

9. The apparatus for generating electrical current from a nuclear decay process of a radioactive material of claim 1, wherein said enclosed volume of radioactive material further comprises a solid material.

10. The apparatus for generating electrical current from a nuclear decay process of a radioactive material of claim 1, wherein said first portion of said junction region is formed within at least one pore formed within a macroporous region of a semiconductor.

11. The apparatus for generating electrical current from a nuclear decay process of a radioactive material of claim 10, wherein said at least one pore formed within said macroporous region has a curved shape.

12. The apparatus for generating electrical current from a nuclear decay process of a radioactive material of claim 11, wherein a throat opening of said at least one pore has a diameter of less than about a mean free path length of a beta particle emitted from said radioactive material.

13. The apparatus for generating electrical current from a nuclear decay process of a radioactive material of claim 11, wherein a throat opening of said at least one pore has a diameter of greater than about 1 $\mu$m and less than about 500 $\mu$m.

14. The apparatus for generating electrical current from a nuclear decay process of a radioactive material of claim 11, wherein a throat opening of said at least one pore has a diameter of greater than about 10 $\mu$m and less than about 100 $\mu$m.

15. The apparatus for generating electrical current from a nuclear decay process of a radioactive material of claim 11, wherein a throat opening of said at least one pore has a diameter of about 70 $\mu$m.

16. The apparatus for generating electrical current from a nuclear decay process of a radioactive material of claim 10, wherein said at least one pore formed within said macroporous region has a multifaceted shape.

17. The apparatus for generating electrical current from a nuclear decay process of a radioactive material of claim 16, wherein a throat opening of said at least one pore has a diameter of less than about a mean free path length of a beta particle emitted from said radioactive material.

18. The apparatus for generating electrical current from a nuclear decay process of a radioactive material of claim 16, wherein a throat opening of said at least one pore has a diameter of greater than about 1 μm and less than about 500 μm.

19. The apparatus for generating electrical current from a nuclear decay process of a radioactive material of claim 10, wherein a length of said at least one pore terminates within a body portion of said semiconductor.

20. The apparatus for generating electrical current from a nuclear decay process of a radioactive material of claim 10, wherein a length of said at least one pore extends entirely through a body portion of said semiconductor.

21. An apparatus for generating electrical current from a nuclear decay process of a radioactive material, the apparatus comprising:

a volume of radioactive material enclosed in a bulk silicon material; and a junction region disposed within at least one pore formed within a body portion of said bulk silicon material, wherein said at least one pore has an aspect ratio of greater than about 20:1.

22. The apparatus for generating electrical current from a nuclear decay process of a radioactive material of claim 21, wherein said at least one pore has an aspect ratio of greater than about 30:1.

23. The apparatus for generating electrical current from a nuclear decay process of a radioactive material of claim 21, wherein said enclosed volume of radioactive material further comprises beta particles emitted during said nuclear decay process.

24. The apparatus for generating electrical current from a nuclear decay process of a radioactive material of claim 21, wherein said enclosed volume of radioactive material further comprises alpha particles emitted during said nuclear decay process.

25. The apparatus for generating electrical current from a nuclear decay process of a radioactive material of claim 21, wherein said enclosed volume of radioactive material further comprises gamma particles emitted during said nuclear decay process.

26. The apparatus for generating electrical current from a nuclear decay process of a radioactive material of claim 21, wherein said enclosed volume of radioactive material further comprises a gaseous material.

27. The apparatus for generating electrical current from a nuclear decay process of a radioactive material of claim 26, wherein said gaseous material further comprises a tritium gas.

28. The apparatus for generating electrical current from a nuclear decay process of a radioactive material of claim 21, wherein said enclosed volume of radioactive material further comprises a liquid material.

29. The apparatus for generating electrical current from a nuclear decay process of a radioactive material of claim 28, wherein said liquid material further comprises a $^{63}$Ni solution.

30. The apparatus for generating electrical current from a nuclear decay process of a radioactive material of claim 21, wherein said enclosed volume of radioactive material further comprises a solid material.

31. The apparatus for generating electrical current from a nuclear decay process of a radioactive material of claim 21, wherein said at least one pore formed within a body portion of said bulk silicon material has a curved shape.

32. The apparatus for generating electrical current from a nuclear decay process of a radioactive material of claim 31, wherein a throat opening of said at least one pore has a diameter of less than about a mean free path length of a beta particle emitted from said radioactive material.

33. The apparatus for generating electrical current from a nuclear decay process of a radioactive material of claim 31, wherein a throat opening of said at least one pore has a diameter of greater than about 1 μm and less than about 500 μm.

34. The apparatus for generating electrical current from a nuclear decay process of a radioactive material of claim 31, wherein a throat opening of said at least one pore has a diameter of greater than about 10 μm and less than about 100 μm.

35. The apparatus for generating electrical current from a nuclear decay process of a radioactive material of claim 31, wherein a throat opening of said at least one pore has a diameter of about 70 μm.

36. The apparatus for generating electrical current from a nuclear decay process of a radioactive material of claim 21, wherein said at least one pore formed within the body of said bulk silicon material has a multifaceted shape.

37. The apparatus for generating electrical current from a nuclear decay process of a radioactive material of claim 36, wherein a throat opening of said at least one pore has a diameter of less than about a mean free path length of a beta particle emitted from said radioactive material.

38. The apparatus for generating electrical current from a nuclear decay process of a radioactive material of claim 36, wherein a throat opening of said at least one pore has a diameter of greater than about 1 μm and less than about 500 μm.

39. The apparatus for generating electrical current from a nuclear decay process of a radioactive material of claim 21, wherein a length of said at least one pore terminates within said body portion of said bulk silicon material.

40. The apparatus for generating electrical current from a nuclear decay process of a radioactive material of claim 21, wherein a length of said at least one pore extends entirely through said body portion of said bulk silicon material.

41. A method for generating electrical current from a nuclear decay process of a radioactive material, the method comprising:

enclosing a volume of radioactive material; and disposing a junction region within said enclosed volume, so that a first portion of said junction region is disposed at a declination angle of greater than about 55° relative to a second portion of said junction region.

42. The method for generating electrical current from a nuclear decay process of a radioactive material of claim 41, the method further comprising:

enclosing a volume of radioactive material that emits beta particles during said nuclear decay process.

43. The method for generating electrical current from a nuclear decay process of a radioactive material of claim 41, the method further comprising:

enclosing a volume of radioactive material that emits alpha particles during said nuclear decay process.

44. The method for generating electrical current from a nuclear decay process of a radioactive material of claim 41, the method further comprising:

enclosing a volume of radioactive material that emits gamma particles during said nuclear decay process.

45. The method for generating electrical current from a nuclear decay process of a radioactive material of claim 41, the method further comprising:

enclosing a volume of gaseous radioactive material.

46. The method for generating electrical current from a nuclear decay process of a radioactive material of claim 45, the method further comprising:

enclosing a volume of tritium gas.

47. The method for generating electrical current from a nuclear decay process of a radioactive material of claim 41, the method further comprising:

enclosing a volume of liquid radioactive material.

48. The method for generating electrical current from a nuclear decay process of a radioactive material of claim 47, the method further comprising:

enclosing a volume of liquid $^{63}$Ni solution.

49. The method for generating electrical current from a nuclear decay process of a radioactive material of claim 41, the method further comprising:

enclosing a volume of solid radioactive material.

50. The method for generating electrical current from a nuclear decay process of a radioactive material of claim 41, the method further comprising:

forming at least one pore in a macroporous region of a semiconductor; and disposing said first junction region within said at least one pore.

51. The method for generating electrical current from a nuclear decay process of a radioactive material of claim 50, the method further comprising:

forming said at least one pore into a curved shape.

52. The method for generating electrical current from a nuclear decay process of a radioactive material of claim 51, the method further comprising:

forming a throat opening of said at least one pore so that a throat diameter of less than about a mean free path length of a beta particle emitted from said radioactive material is obtained.

53. The method for generating electrical current from a nuclear decay process of a radioactive material of claim 51, the method further comprising:

forming a throat opening of said at least one pore so that a throat diameter of greater than about 1 $\mu$m and less than about 500 $\mu$m is obtained.

54. The method for generating electrical current from a nuclear decay process of a radioactive material of claim 51, the method further comprising:

forming a throat opening of said at least one pore so that a throat diameter of greater than about 10 $\mu$m and less than about 100 $\mu$m is obtained.

55. The method for generating electrical current from a nuclear decay process of a radioactive material of claim 51, the method further comprising:

forming a throat opening of said at least one pore so that a throat diameter of about 70 $\mu$m is obtained.

56. The method for generating electrical current from a nuclear decay process of a radioactive material of claim 50, the method further comprising:

forming said at least one pore into a multifaceted shape.

57. The method for generating electrical current from a nuclear decay process of a radioactive material of claim 56, the method further comprising:

forming a throat opening of said at least one pore so that a throat diameter of less than a mean free path length of a beta particle emitted from said radioactive material is obtained.

58. The method for generating electrical current from a nuclear decay process of a radioactive material of claim 56, the method further comprising:

forming a throat opening of said at least one pore so that a throat diameter of about greater than about 1 $\mu$m and less than about 500 $\mu$m is obtained.

59. The method for generating electrical current from a nuclear decay process of a radioactive material of claim 50, the method further comprising:

forming a length of said at least one pore so that said length terminates within a body portion of said semiconductor.

60. The method for generating electrical current from a nuclear decay process of a radioactive material of claim 50, the method further comprising:

forming a length of said at least one pore so that said length extends entirely through a body portion of said semiconductor.

61. A method for generating electrical current from a nuclear decay process of a radioactive material, the method comprising:

enclosing a volume of radioactive material in a bulk silicon material;

forming at least one pore within a body portion of said bulk silicon material so that said at least one pore has an aspect ratio of greater than about 20:1, and disposing a junction region within said at least one pore.

62. The method for generating electrical current from a nuclear decay process of a radioactive material of claim 61, the method further comprising:

forming said at least one pore so that said at least one pore has an aspect ratio of greater than about 30:1.

63. The method for generating electrical current from a nuclear decay process of a radioactive material of claim 61, the method further comprising:

enclosing a volume of radioactive material that emits beta particles during said nuclear decay process.

64. The method for generating electrical current from a nuclear decay process of a radioactive material of claim 61, the method further comprising:

enclosing a volume of radioactive material that emits alpha particles during said nuclear decay process.

65. The method for generating electrical current from a nuclear decay process of a radioactive material of claim 61, the method further comprising:

enclosing a volume of radioactive material that emits gamma particles during said nuclear decay process.

66. The method for generating electrical current from a nuclear decay process of a radioactive material of claim 61, the method further comprising:

enclosing a volume of gaseous radioactive material.

67. The method for generating electrical current from a nuclear decay process of a radioactive material of claim 66, the method further comprising:

enclosing a volume of tritium gas.

68. The method for generating electrical current from a nuclear decay process of a radioactive material of claim 61, the method further comprising:

enclosing a volume of liquid radioactive material.

69. The method for generating electrical current from a nuclear decay process of a radioactive material of claim 68, the method further comprising:

enclosing a volume of liquid $^{63}$Ni solution.

70. The method for generating electrical current from a nuclear decay process of a radioactive material of claim 61, the method further comprising:

enclosing a volume of solid radioactive material.

71. The method for generating electrical current from a nuclear decay process of a radioactive material of claim 61, the method further comprising:

forming said at least one pore into a curved shape.

72. The method for generating electrical current from a nuclear decay process of a radioactive material of claim 71, the method further comprising:

forming a throat opening of said at least one pore so that a throat diameter of less than about a mean free path length of a beta particle emitted from said radioactive material is obtained.

73. The method for generating electrical current from a nuclear decay process of a radioactive material of claim 71, the method further comprising:

forming a throat opening of said at least one pore so that a throat diameter of greater than about 1 μm and less than about 500 μm is obtained.

74. The method for generating electrical current from a nuclear decay process of a radioactive material of claim 71, the method further comprising:

forming a throat opening of said at least one pore so that a throat diameter of greater than about 10 μm and less than about 100 μm is obtained.

75. The method for generating electrical current from a nuclear decay process of a radioactive material of claim 71, the method further comprising:

forming a throat opening of said at least one pore so that a throat diameter of about 70 μm is obtained.

76. The method for generating electrical current from a nuclear decay process of a radioactive material of claim 61, the method further comprising:

forming said at least one pore into a multifaceted shape.

77. The method for generating electrical current from a nuclear decay process of a radioactive material of claim 76, the method further comprising:

forming a throat opening of said at least one pore so that a throat diameter of less than about a mean free path length of a beta particle emitted from said radioactive material is obtained.

78. The method for generating electrical current from a nuclear decay process of a radioactive material of claim 76, the method further comprising:

forming a throat opening of said at least one pore so that a throat diameter of greater than about 1 μm and less than about 500 μm is obtained.

79. The method for generating electrical current from a nuclear decay process of a radioactive material of claim 61, the method further comprising:

forming a length of said at least one pore so that said length terminates within a body portion of said bulk silicon material.

80. The method for generating electrical current from a nuclear decay process of a radioactive material of claim 61, the method further comprising:

forming a length of said at least one pore so that said length extends entirely through a body portion of said bulk silicon material.

* * * * *